United States Patent
Tanaka et al.

(10) Patent No.: US 11,319,212 B2
(45) Date of Patent: May 3, 2022

(54) METHOD FOR STABILIZING CHLOROSILANE POLYMER

(71) Applicant: IHI Corporation, Koto-ku (JP)

(72) Inventors: Yasutomo Tanaka, Tokyo (JP); Yuuta Ootsuka, Tokyo (JP); Wataru Kubota, Tokyo (JP); Masato Ishizaki, Tokyo (JP); Kozue Akazaki, Tokyo (JP)

(73) Assignee: IHI Corporation, Koto-ku (JP)

( * ) Notice: Subject to any disclaimer, the term of this patent is extended or adjusted under 35 U.S.C. 154(b) by 174 days.

(21) Appl. No.: 16/282,413

(22) Filed: Feb. 22, 2019

(65) Prior Publication Data

US 2019/0256362 A1     Aug. 22, 2019

Related U.S. Application Data

(63) Continuation of application No. PCT/JP2017/035981, filed on Oct. 3, 2017.

(30) Foreign Application Priority Data

Nov. 16, 2016   (JP) .............................. JP2016-222956

(51) Int. Cl.
   *C01B 33/107*     (2006.01)
   *C23C 16/24*      (2006.01)
   (Continued)

(52) U.S. Cl.
   CPC ...... *C01B 33/10794* (2013.01); *C01B 33/107* (2013.01); *C23C 16/24* (2013.01);
   (Continued)

(58) Field of Classification Search
   None
   See application file for complete search history.

(56) References Cited

U.S. PATENT DOCUMENTS

| 6,042,654 A | 3/2000 | Comita et al. |
| 2007/0148075 A1 | 6/2007 | Popken et al. |

(Continued)

FOREIGN PATENT DOCUMENTS

| CN | 1926061 A | 3/2007 |
| CN | 101284843 A | 10/2008 |

(Continued)

OTHER PUBLICATIONS

Google translationIshii et al. JP2016013965A; Sep. 2020.*

(Continued)

*Primary Examiner* — Guinever S Gregorio
(74) *Attorney, Agent, or Firm* — Oblon, McClelland, Maier & Neustadt, L.L.P.

(57) ABSTRACT

This disclosure is to make it possible to easily stabilize a chlorosilane polymer while preventing a solid chlorosilane polymer from being generated. Disclosed is a method for stabilizing a chlorosilane polymer generated secondarily in a step of a chemical vapor deposition method using chlorosilane-based gas, the method including: a step of bringing alcohol into contact with the chlorosilane polymer, degrading the chlorosilane polymer to alkoxide, hydrogen chloride and hydrogen, and diluting the degraded alkoxide with the alcohol; and a step of performing hydrolysis for the alkoxide.

6 Claims, 5 Drawing Sheets

(51) Int. Cl.
    *C23C 16/32*     (2006.01)
    *C23C 16/56*     (2006.01)
    *C23C 16/44*     (2006.01)

(52) U.S. Cl.
    CPC ............ *C23C 16/325* (2013.01); *C23C 16/44* (2013.01); *C23C 16/56* (2013.01)

(56) References Cited

U.S. PATENT DOCUMENTS

| | | |
|---|---|---|
| 2009/0104100 A1 | 4/2009 | Imamura et al. |
| 2013/0316515 A1 | 11/2013 | Nagahara et al. |
| 2015/0251916 A1 | 9/2015 | Kim et al. |

FOREIGN PATENT DOCUMENTS

| | | |
|---|---|---|
| CN | 103354948 A | 10/2013 |
| CN | 104797527 A | 7/2015 |
| JP | 64-5904 | 1/1989 |
| JP | 64-75493 A | 3/1989 |
| JP | 4-124011 | 4/1992 |
| JP | 11-180713 A | 7/1999 |
| JP | 2003-526731 | 9/2003 |
| JP | 4937998 | 5/2012 |
| JP | 2016-13965 | 1/2016 |
| JP | 2016-13966 | 1/2016 |
| RU | 2 344 993 C1 | 1/2009 |
| RU | 2 496 715 C2 | 10/2013 |
| WO | WO 2016/011993 A1 | 1/2016 |

OTHER PUBLICATIONS

Decision to Grant dated Jun. 16, 2020 in corresponding Japanese Patent Application No. 2018-551065, 1 page.
International Search Report dated Nov. 7, 2017 in PCT/JP2017/035981 filed Oct. 3, 2017 (with English Translation).
Written Opinion dated Nov. 7, 2017 in PCT/JP2017/035981 filed Oct. 3, 2017.
"Materials Handling Guide: Hydrogen-Bonded Silicon Compounds", SiH Handling Guide, Developed by the Operating Safety Committee of the Silicones Environmental, Health and Safety Council of North America, Aug. 2007, 39 pages.
"Investigation Report on Explosion Fire Accident of High-Purity Polycrystalline Silicon Production Facility in Yokkaichi Plant of Mitsubishi Materials Corporation, Investigation Committee on Explosion Fire Accident in Yokkaichi Plant of Mitsubishi Materials Corporation", Jun. 12, 2014, 95 pages (with English Abstract).
Combined Office Action and Search Report dated Dec. 24, 2019 in Russia Patent Application No. 2019118081, 15 pages (with English translation).
Official Action dated Sep. 13, 2021 in corresponding Chinese application 201780051456.2.

* cited by examiner

ETHOXYLATE IN WHICH GELATION PROCEEDS
IN ATMOSPHERE FOR APPROXIMATELY 10 DAYS

METHOD FOR STABILIZING CHLOROSILANE POLYMER

CROSS-REFERENCES TO RELATED APPLICATION

This application is a continuation application of International Application No. PCT/JP2017/035981, filed on Oct. 3, 2017, which claims the priorities of Japanese Patent Application No. 2016-222956, filed on Nov. 16, 2016, the entire contents of which are incorporated by reference herein.

TECHNICAL FIELD

This disclosure relates to a method for stabilizing a chlorosilane polymer generated secondarily in a step of a chemical vapor deposition (CVD) method using chlorosilane-based gas.

RELATED ART

Heretofore, in a step of precipitating a silicon carbide (SiC) matrix in a ceramic matrix composite (CMC) and a step of precipitating silicon (Si) in a semiconductor material, the silicon carbide matrix and the silicon are precipitated by pyrolyzing chlorosilane-based gas such as methyltrichlorosilane ($CH_3SiCl_3$) and trichlorosilane ($SiHCl_3$) at a temperature as high as 600° C. or higher. At this time, $SiCl_n$ (n=1 to 4) containing radicals is generated secondarily, and a chlorosilane polymer having a Si—Si bond is formed using the generated gas as a precursor.

Such a reaction of forming the chlorosilane polymer proceeds in an exhaust gas pipe with a temperature lower than a temperature of a reactor, and the chlorosilane polymer that is a viscous liquid is deposited in such an exhaust pipe, and remains without being discharged by purge of an inside of a device.

The chlorosilane polymer is chemically unstable, easily reacts with water vapor in the atmosphere, and generates hydrogen chloride and hydrogen as shown in Reaction formula (A). Accordingly, the chlorosilane polymer is dangerous. Here, "chemically unstable" refers to a state in which a compound has high reactivity and is prone to cause a strong reaction.

$$(SiCl_2)_n + 2nH_2O \rightarrow nSiO_2 + 2nHCl + nH_2 \quad (A)$$

Therefore, before opening the device to the atmosphere, water is introduced into the device while being controlled in a state of being filled with inert gas or in a vacuum state, and the reaction of Reaction formula (A) is promoted actively. In this way, the chlorosilane polymer is stabilized. Here, "stabilizing a compound" refers to degrading the compound to a substance with low reactivity. When this technique is applied, the generated hydrogen chloride (HCl) is dissolved into the introduced water, hydrogen gas ($H_2$) thus generated is discharged, and silicon dioxide ($SiO_2$) adheres to an inside of the pipe. The silicon dioxide thus adhered can be peeled off and flushed away by cleaning the pipe.

However, for chlorosilane polymer deposited as thick as a few millimeters, the reaction in Reaction formula (A) proceeds too rapidly. Accordingly, shells of crosslinked gel of $SiO_2$ are formed on a surface of the chlorosilane polymer, and water is inhibited from permeating an inside of the of the chlorosilane polymer. This fact is disclosed in and known from the following NPL 1.

Moreover, a small amount of solid chlorosilane polymer is formed as an intermediate degradation product inside and under gelled portions. The solid chlorosilane polymer has higher firing and exploding risks than the viscous liquid chlorosilane polymer. As being dried, the solid chlorosilane polymer increases explosive force and impact sensitivity. This phenomenon is disclosed in and known from the following NPLs 1 and 2. When the solid chlorosilane polymer is formed inside and under the silicon dioxide that has adhered to the pipe after hydrolysis, the solid chlorosilane polymer fires and explodes due to an impact at the time of being peeled off.

CITATION LIST

Patent Literature

PTL 1: JP 2016-13965 A
PTL 2: JP. 2016-13966 A

Non-Patent Literature

NPL 1: "Materials Handling Guide: Hydrogen-Bonded Silicon Compounds" Developed by the Operating Safety Committee of the Silicones Environmental, Health and Safety Council of North America, August 2007

NPL 2: Investigation Report on Explosion Fire Accident of High-Purity Polycrystalline Silicon Production Facility in Yokkaichi Plant of Mitsubishi Materials Corporation, Jun. 12, 2014, Investigation Committee on Explosion Fire Accident in Yokkaichi Plant of Mitsubishi Materials Corporation

SUMMARY

Technical Problem

In the conventional treatment method of the chlorosilane polymer, in a hydrolysis process of the viscous liquid chlorosilane polymer deposited to a thickness of few millimeters, it has been impossible to prevent the generation of the solid chlorosilane polymer since the shells of the gel (silica) are formed outside the chlorosilane polymer. Even if the viscous liquid chlorosilane polymer is collected to a cold trap and others, it has been difficult to stabilize the chlorosilane polymer because of the above-mentioned reason. Moreover, when the hydrolysis is carried out for the viscous liquid chlorosilane polymer deposited in a narrow inside of each of pipe components in a heat exchanger, a pump and the like, the silica has adhered to the inside, and it has been difficult to remove the silica.

This disclosure has been proposed in view of the above-mentioned actual circumstances. It is an object of this disclosure to provide a method for stabilizing a chlorosilane polymer, the method preventing the solid chlorosilane polymer from being generated, being capable of easily stabilizing the chlorosilane polymer, and preventing the silica from adhering to the narrow inside of each of the pipe components, the silica being generated from the viscous liquid chlorosilane polymer deposited in the narrow inside.

Solution to Problem

In order to solve the above-mentioned problem, a method of this disclosure is a method for stabilizing a chlorosilane polymer generated secondarily in a step of a chemical vapor deposition method using chlorosilane-based gas, the method including: a step of bringing alcohol into contact with the chlorosilane polymer, degrading the chlorosilane polymer to alkoxide, hydrogen chloride and hydrogen, and diluting the degraded alkoxide with an alcohol solvent; and a step of performing hydrolysis for the alkoxide.

The step of the chemical vapor deposition method may deposit at least one of silicon carbide, silicon and a silicon compound. The chlorosilane-based gas may include at least one of methyltrichlorosilane and trichlorosilane. The alcohol may include lower alcohol of butanol or lower. The alkoxide may include tetraethoxysilane.

Effects

In accordance with this disclosure, the solid chlorosilane polymer is not generated, and the chlorosilane polymer can be easily stabilized. Moreover, the silica can be prevented from adhering to the narrow inside of the pipe component, the silica being generated from the viscous liquid chlorosilane polymer deposited in the narrow inside.

DETAILED DESCRIPTION OF EMBODIMENTS

Hereinafter, with reference to the drawings, a detailed description will be given of an embodiment of a method for stabilizing a chlorosilane polymer generated secondarily in a step of a chemical vapor deposition method using chlorosilane-based gas.

The inventor of the present application focused attention on the following point as a factor of the problem inherent in the conventional technology. That is, since the chlorosilane polymer is a viscous liquid with high viscosity at room temperature, the chlorosilane polymer tends to form shells of gel (silica) on an outside thereof, and the shells inhibit a sufficient inward supply of water to complete hydrolysis.

Figure 1:
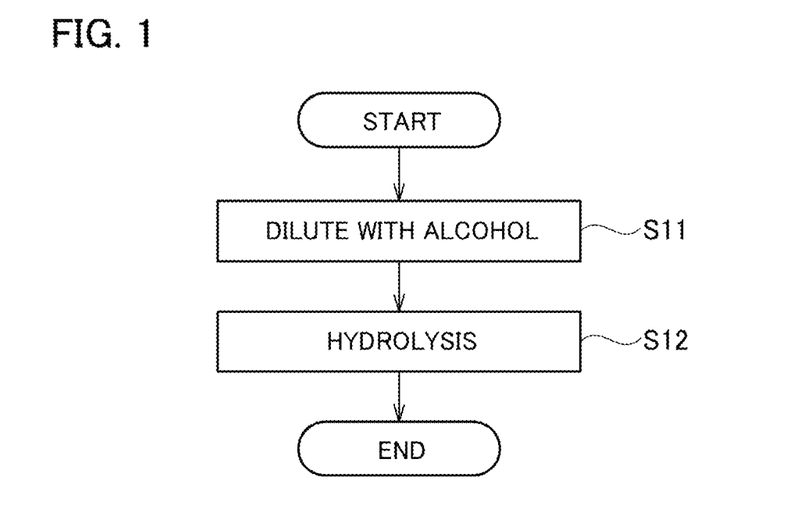
FIG. 1 is a flowchart showing a series of steps in an embodiment.

FIG. 1 is a flowchart showing a series of steps of the method in this embodiment. The inventor found a method of degrading the chlorosilane polymer in two steps, which are: a step of bringing the chlorosilane polymer into contact with a sufficient amount of alcohol, degrading the chlorosilane polymer into alkoxide, hydrogen chloride and hydrogen once, and diluting the degraded alkoxide, hydrogen chloride and hydrogen with alcohol (Step S11); and thereafter performing hydrolysis for the diluted alkoxide (Step S12).

In Step S11, as shown in Reaction formula (1), the chlorosilane polymer is brought into contact with alcohol, is thereby degraded to alkoxide, hydrogen chloride and hydrogen, and the degraded alkoxide, hydrogen chloride and hydrogen are diluted with alcohol.

$$(SiCl_2)_n + 4nROH \rightarrow nSi(OR)_4 + 2nHCl + nH_2 \quad (1)$$

In Step S12, as shown in Reaction formula (2), the alkoxide is subjected to hydrolysis, and silica is precipitated.

$$Si(OR)_4 + 2H_2O \rightarrow SiO_2 + 4ROH \quad (2)$$

Here, the alcohol in Step S11 may be lower alcohol that is butanol or lower. As the lower alcohol, lower alcohol that has hydrophilicity is favorable since a reaction in Reaction formula (1) of alkoxidation with the chlorosilane polymer is rapid and a following reaction in Reaction formula (2) of the hydrolysis is rapid.

In the method of this embodiment, such a two-step reaction in which the viscous liquid chlorosilane polymer is denatured to alkoxide and the alkoxide is subjected to the hydrolysis is adopted. In this way, the stabilization to silica can be achieved without forming the solid chlorosilane polymer.

Moreover, in the method of this embodiment, it is also possible to perform alkoxidation for a viscous liquid chlorosilane polymer deposited to a few centimeters. Accordingly, the chlorosilane polymer is collected and treated intensively using the cold trap and others, thus making it possible to reduce a deposited amount of the chlorosilane polymer on other portions.

Moreover, use of the method of this embodiment makes it possible to treat the chlorosilane polymer after discharging the chlorosilane polymer as the alkoxide to the outside of the heat exchanger and the pump. As described above, in accordance with the method of this embodiment, such a risk that a flammable by-product is generated following the collection and treatment of the chlorosilane polymer is eliminated, and it becomes possible to handle the chlorosilane polymer easily and safely.

EXAMPLE 1

The method of this embodiment is applied to a chlorosilane polymer generated secondarily in a production process of a ceramic matrix composite (CMC). Such a CMC production process includes a chemical vapor impregnation (CVI) step as one of steps therein. In the CVI step, a chemical vapor deposition (CVD) method is applied to a ceramic preform, and a precipitate is impregnated into the preform.

In the CVI step, as shown in Reaction formula (3), methyltrichlorosilane (MTS) is introduced as a raw material into a reaction chamber, and silicon carbide (SiC) is precipitated into an inside of a fiber molded product at a temperature as high as approximately 1000° C. under a reduced pressure of several hundred pascals.

$$CH_3SiCl_3 + H_2 \rightarrow SiC + 3HCl + H_2 \quad (3)$$

In the reaction using a chlorosilane compound such as the MTS, the chlorosilane polymer is deposited in a state of the viscous liquid on an exhaust pipe lower in temperature than the reaction chamber. In Example 1, the cold trap was installed in the middle of the exhaust pipe, and an exhaust gas component was collected actively.

After the CVI step, the cold trap was returned to room temperature, and volatile components such as the MTS and $SiCl_4$ were discharged. Then, industrial ethanol (isopropyl alcohol (IPA): 1%) was introduced into the cold trap, and the discharge was controlled while confirming pressure rises of HCl and $H_2$ gas generated following the degradation of the chlorosilane polymer, whereby such a reduced pressure state was held.

After the ethanol was poured into the chlorosilane polymer, the ethanol emitted HCl and $H_2$ while reducing a pressure thereof and boiling. In this state, ethoxylation proceeded in accordance with Reaction formula (4).

$$(SiCl_2)_n + 4nEtOH \rightarrow nSi(OEt)_4 + 2nHCl + nH_2 \quad (4)$$

It was regarded that such an ethoxylation reaction proceeded sufficiently when bubbles generated owing to the emission of the HCl and $H_2$ gas decreased. It was confirmed that, when a further pressure reduction was performed to reduce the pressure of the ethanol and boil the ethanol, the ethanol was stirred intensely, the emission of the bubbles then gradually came to an end, and a liquid remained after the ethanol was evaporated.

A main component of the liquid after the ethoxylation is considered to be $Si(OEt)_4$ (tetraethoxysilane: TEOS). The TEOS is a liquid having lower viscosity than the chlorosilane polymer in a state of being dispersed in a large amount of ethanol. Therefore, as shown in Reaction formula (5), an ethanol solution of the TEOS is poured into a large amount of water, whereby the object to complete the hydrolysis can be achieved without forming a hydrolysis product enclosed in the shells (gel, silica).

$$Si(OEt)_4 + 2H_2O \rightarrow SiO_2 + 4EtOH \qquad (5)$$

In Example 1, the TEOS was reacted slowly with moisture in the atmosphere, and the progress of gelation thereof was confirmed. A main component of the emitted gas was ethanol, and minor components thereof were HCl and $H_2$.

Figure 2:
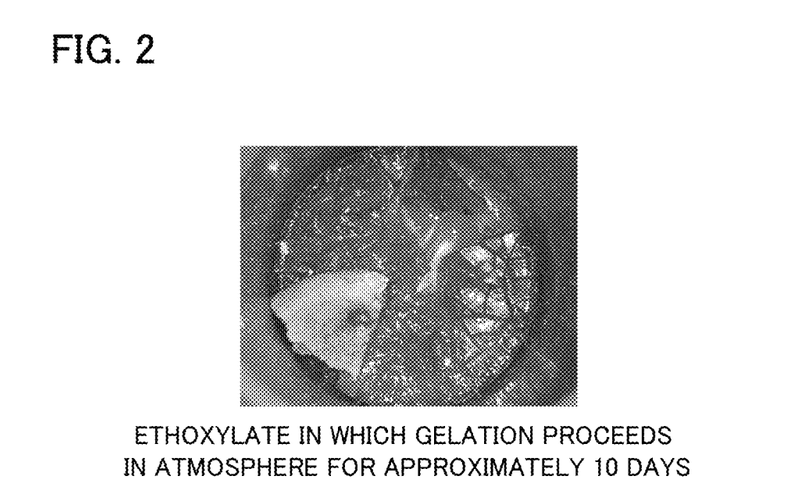
FIG. 2 is a photograph showing an ethoxylate after a lapse of approximately five days since the ethoxylate was moved from another vessel and left at room temperature while discharging emitted gas to a scrubber.

FIG. 2 is a photograph showing an ethoxylate after a lapse of approximately 10 days. This ethoxylate is observed to be transformed to a solid substance.

Figure 3A:
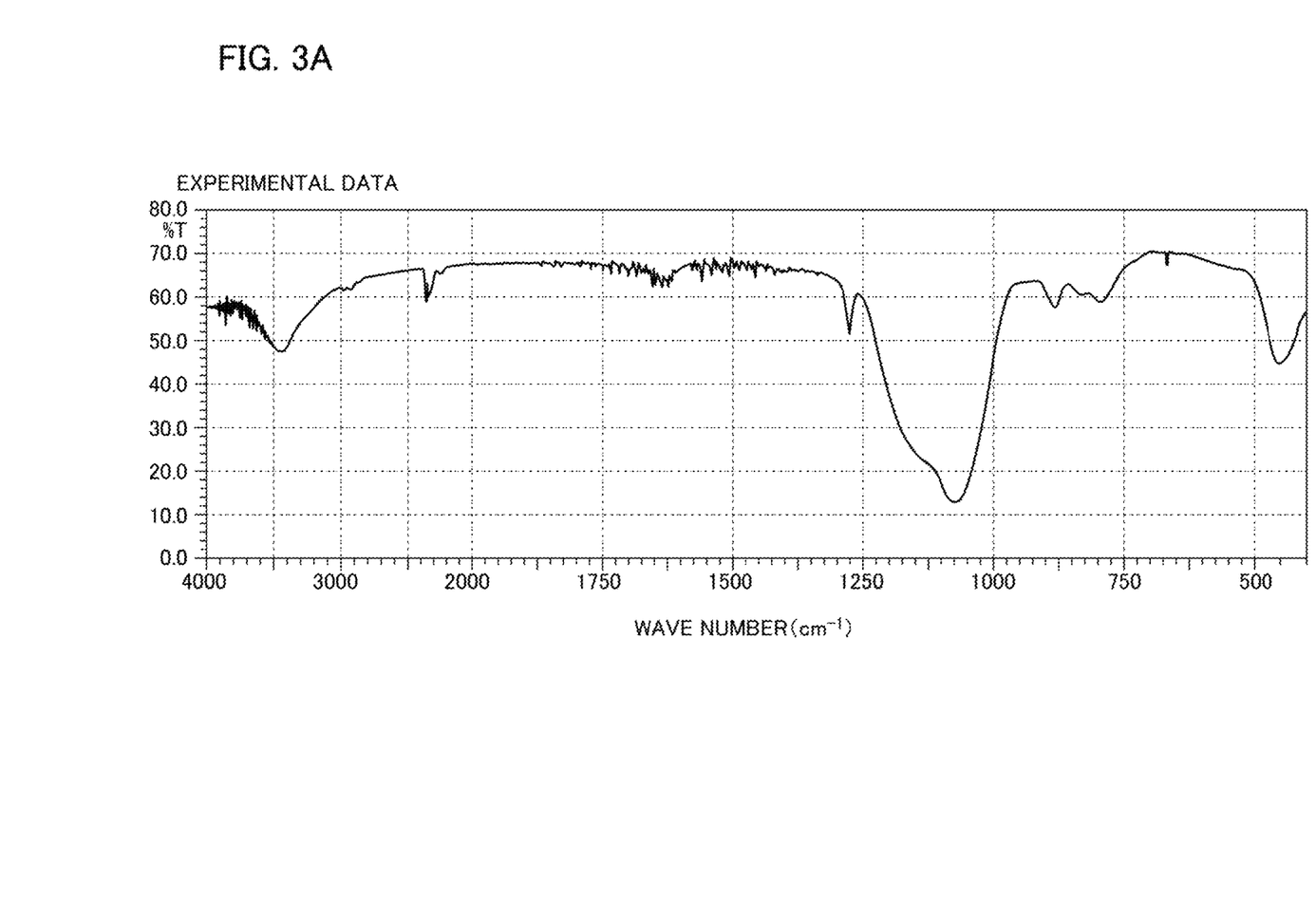
FIG. 3A and FIG. 3B are graphs showing an analysis by Fourier transform infrared spectroscopy.
Figure 3B:
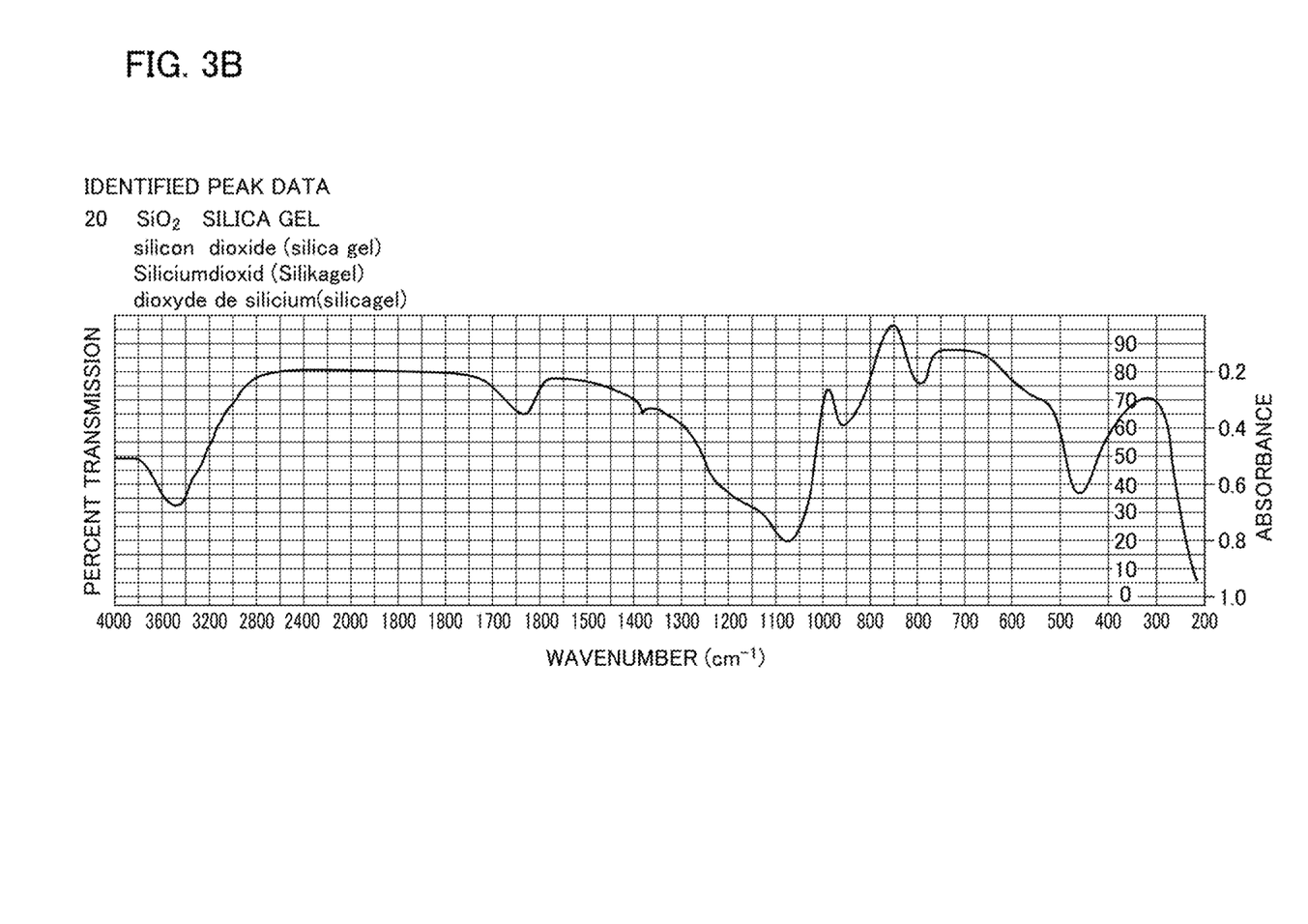

FIG. 3A is a graph showing a result of analyzing the ethoxylate in FIG. 2 by Fourier transform infrared spectroscopy This analysis result has a peak coinciding with a peak in a graph shown in FIG. 3B and regarding spectral characteristics of silica gel ($SiO_2$) that is silica obtained in a sol-gel method. Therefore, the ethoxylate shown in FIG. 2 is identified to be silica.

At a glance, it seems that Example 1 increases a risk of causing fire since inflammable matter (alcohol) is added to a spontaneous combustion substance (chlorosilane polymer). Actually, however, there is no risk that the alcohol may fire since the series of steps in Example 1 is carried out in inert gas by a vacuum tank. It is possible to gradually discharge excessive ethanol to the outside of the vacuum tank by evacuation or the like. Accordingly, it is possible to collect the excessive ethanol as the TEOS when the device is opened to the atmosphere.

Example 1 acts effectively on the pipe components (a pipe, a pump, a valve body (including a throttle valve) and a wall surface of a (cold wall-type) reactor vessel, and glass of a viewport). The chlorosilane polymer is deposited on the pipe components and the wall surface of the reactor vessel. Particularly, Example 1 is effective for washing an evacuation vacuum pump.

Note that the ethanol allows a certain amount of impurities including water. The certain amount may be 10% or less. An example of the impurities includes isopropyl alcohol (IPA). Even industrial ethanol added with the IPA can be expected to exert a sufficient effect. However, an amount of water may be as small as possible due to the object of this disclosure.

In Example 1, alcohol other than the ethanol may be used. The alcohol to be brought into contact with the chlorosilane polymer may be either liquid or vapor. The chlorosilane polymer and the alcohol may be heated. A temperature of the heating may be selected for the purpose of controlling a rate of the degradation reaction of the chlorosilane polymer.

The reaction of the chlorosilane polymer and the alcohol may be carried out at a reduced pressure or in inert gas. The chlorosilane polymer and the alcohol may be stirred in order to promote the degradation.

In Example 1, the gases of $H_2$, HCl and a trace amount of $C_2H_5Cl$, which are generated secondarily at the time of ethoxylation, are discharged from a detoxification device (a scrubber of an alkaline solution, or the like). When it is expected that the ethoxylation reaction has proceeded sufficiently, it is possible to selectively remove the excessive ethanol by evacuation or heating.

The TEOS does not evaporate but remains up to 1000 Pa at room temperature or the atmospheric pressure at 100° C. Accordingly, the TEOS remains even after the ethanol is volatilized. However, in the case of volatilizing the ethanol by decompression boiling, a liquid pressure decreases rapidly by latent heat of vaporization. A liquid remaining after the ethoxylation includes a chloride and an oxide, which include ethyl chloride and are derived from ethanol, as well as the ethanol solution of the TEOS.

pH of the liquid after the ethoxylation exhibits strong acidity, and accordingly, the liquid needs to be neutralized after the hydrolysis. Heat of reaction is generated at each of the time of the hydrolysis and the time of the neutralization. Considering safety, step-by-step treatment should be carried out, and attention should be paid to bumping of the liquid. In the step-by-step treatment, the liquid is diluted with a sufficient amount of water while being stirred, and is then neutralized by alkaline water.

When the ethoxylation is insufficient, and the chlorosilane polymer remains, then there is a risk that the liquid may cause a nucleophilic reaction to the alkaline water and may fire at the time of the neutralization.

When the ethoxylated liquid is reacted slowly with moisture in the atmosphere, the gelation of the liquid proceeds, and becomes silica in one to two weeks. In this case, the neutralization is not performed. The ethoxylated liquid contains chloride as impurities, and emits $H_2$, HCl and the trace amount of $C_2H_5Cl$ as the gelation proceeds. Accordingly, $H_2$, HCl and the trace amount of $C_2H_5Cl$ are discharged to the detoxification device (the scrubber of the alkaline solution, or the like).

EXAMPLE 2

A mechanical booster pump is used as the evacuation vacuum pump for use in the CVI step. The pump is extremely expensive, and there has not been an effective method for cleaning the pump though a variety of efforts have been made in order to prevent condensation of the chlorosilane polymer thereon. Therefore, it has been frequent that the pump is used until breaking down by being rotated all year round while flowing $N_2$ gas therethrough. Example 2 illustrates degradation and removal of the chlorosilane polymer in the pump according to this embodiment.

Heretofore, when the pump has been cleaned, water has been used in some cases in order to stabilize the chlorosilane polymer and to absorb the hydrogen chloride generated at the time of the stabilization. When water is used, the chlorosilane polymer is transformed to silica by the hydrolysis, and accordingly, a solid remains inside the pump. The silica remaining in the pump is attempted to be discharged by being rubbed or by means such as high-pressure cleaning. However, it is difficult to discharge the silica at spots inside the pump, where a clearance is small. The remaining silica may cause biting to break down the pump.

Application of Example 1 makes it possible to remove the chlorosilane polymer attached to the evacuation vacuum pump. The chlorosilane polymer attached to a surface of a pump rotor is collected after being ethoxylated by ethanol vapor and liquid. Thereafter, the inside of the pump is cleaned by water vapor and water. Then, the chlorosilane polymer can be removed while preventing the silica from adhering to the surface of the pump rotor.

When this embodiment is applied, the chlorosilane polymer is discharged once as the TEOS to the outside of the pump, and is thereafter subjected to the hydrolysis. Accordingly, an amount of the chlorosilane polymer remaining inside the pump can be minimized. In this case, introduction of the vapor ethanol into the pump can save an amount of ethanol usage more than introduction of the liquid ethanol into the pump.

Figure 4:
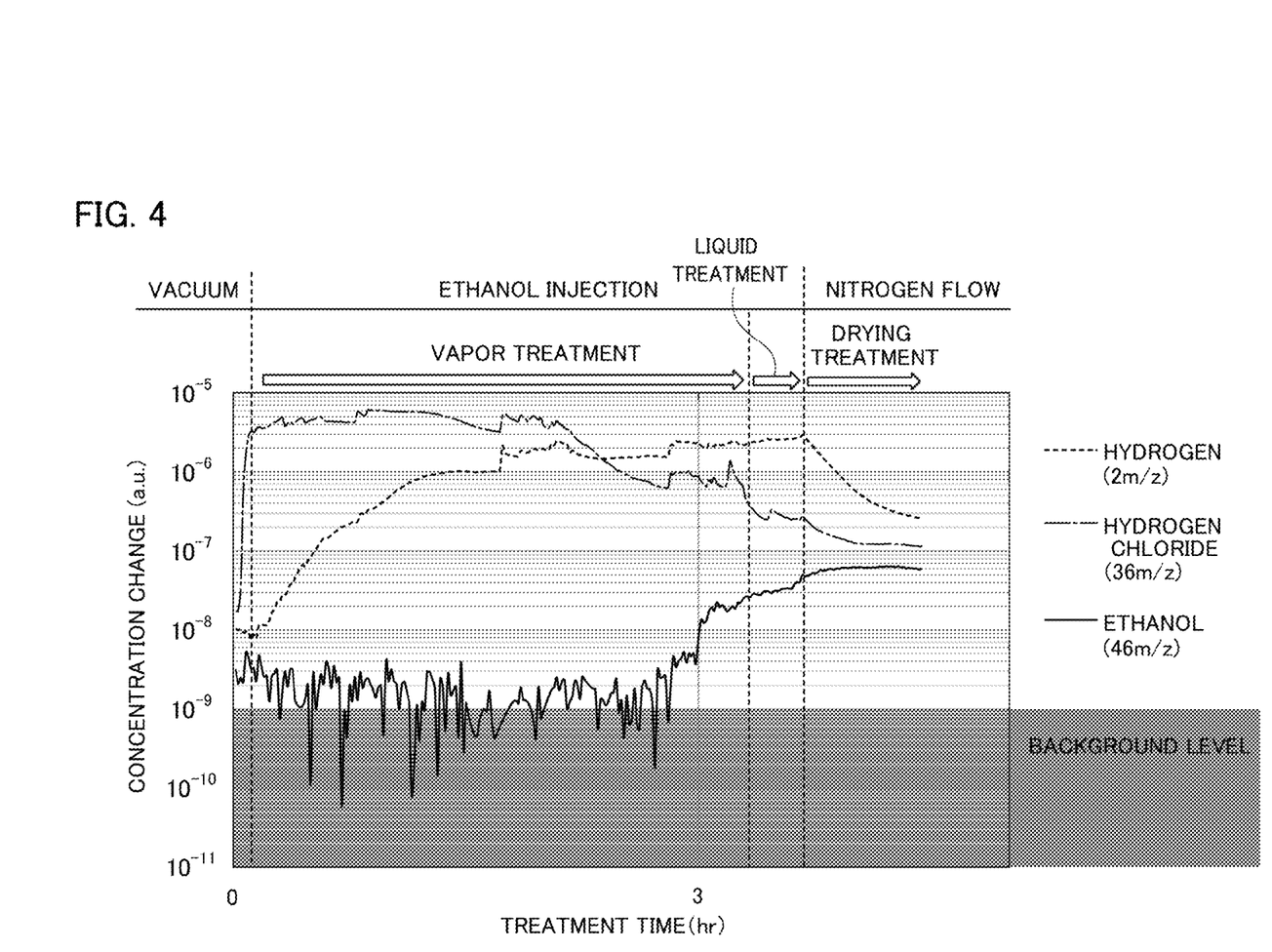
FIG. 4 is a graph showing analysis results of gases generated in a series of steps in Example 2.

FIG. 4 is a graph showing analysis results of gases generated in a series of steps in Example 2. An axis of abscissas represents a treatment time (minute), and an axis of ordinates represents changes of concentrations (arbitrary unit). The analysis results illustrate that, when the treatment using the ethanol vapor is started, the concentration of the hydrogen chloride rises rapidly, and the concentration of the hydrogen rises gradually. The generation of HCl proves that Cl of the Si—Cl bond is substituted with an ethoxy group. The generation of $H_2$ proves that the Si—Si link is disconnected. Moreover, the analysis results illustrate that an excessive component of the ethanol appeared in a few hours from a background level, and that the degradation of the chlorosilane polymer is completed.

Note that, though the methyltrichlorosilane (MTS) is exemplified as the chlorosilane-based gas in this embodiment, the chlorosilane-based gas is not limited to this, and for example, other types such as trichlorosilane may be used. Moreover, in the chemical vapor deposition method, the silicon carbide is precipitated; however, the compound to be precipitated is not limited to this, and other types such as a silicon compound may be precipitated.

COMPARATIVE EXAMPLE 1

Figure 5A:
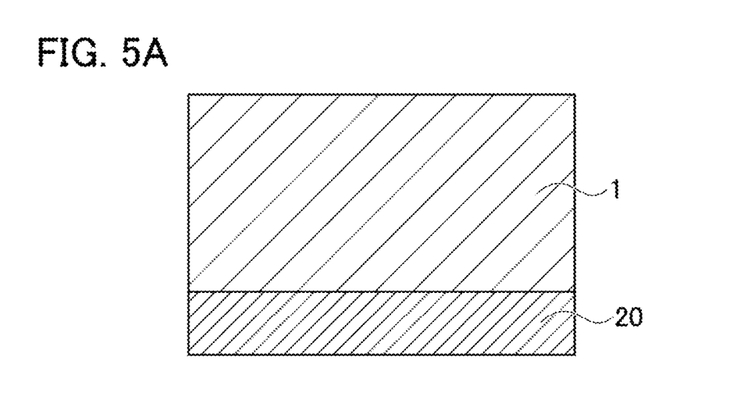
FIG. 5A to FIG. 5C are a schematic diagrams showing situations of respective steps in Comparative example 1.
Figure 5B:
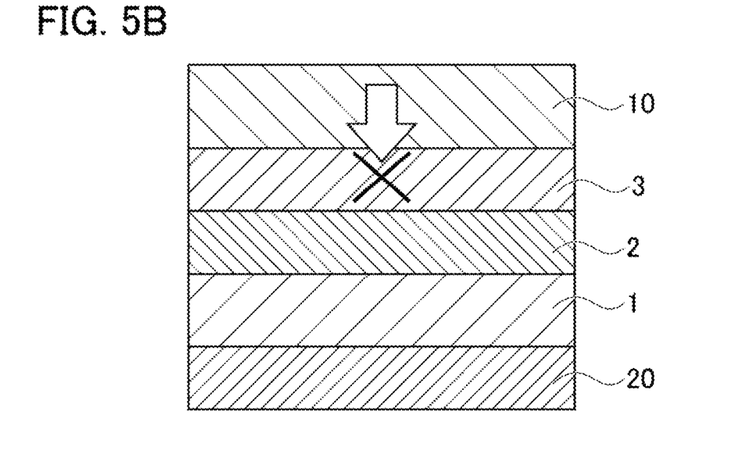
Figure 5C:
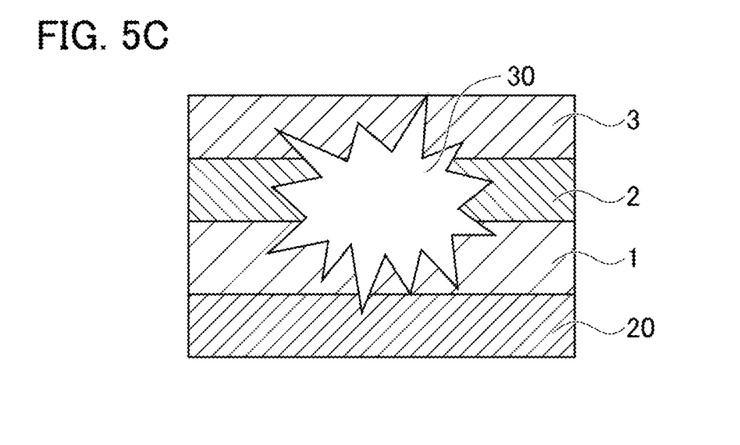

For comparison with Examples 1 and 2 described above, illustrated is an example of treating the chlorosilane polymer by the hydrolysis without dilution with alcohol. FIG. 5A to FIG. 5C show schematic views in respective steps in Comparative example 1.

In Comparative example 1, $N_2$ substitution is repeated in the device, and thereafter, water is introduced into the device, and the chlorosilane polymer is soaked in the water. A water soaking time is set in response to a deposited thickness of the chlorosilane polymer. After a lapse of several hours to several weeks, silica and a hydrolysis product are rubbed off in the water, are sufficiently crushed in acidic wash water, and thereafter, are degraded and neutralized in alkaline water.

FIG. 5A is a schematic view showing a situation of a pipe 20 in which a chlorosilane polymer 1 is deposited. FIG. 5B is a schematic view showing a situation where water 10 is applied to the chlorosilane polymer 1. A surface layer of the chlorosilane polymer 1 is subjected to the hydrolysis and forms a solid body of silica 3, and in some cases, this reaction remains on the surface and does not reach an inside of the chlorosilane polymer. A small amount of a solid chlorosilane polymer 2 is formed between the chlorosilane polymer 1 and the silica 3.

FIG. 5C is a schematic view showing a situation when the chlorosilane polymer 1 is enclosed inside the silica 3 on the surface. At the time of peeling off the silica 3 that adheres to the pipe, it is possible that the enclosed solid chlorosilane polymer 2 may explode or fire as denoted by reference numeral 30.

COMPARATIVE EXAMPLE 2

Comparative example 2 is an example of treating the chlorosilane polymer, which is deposited in the pipe, by the hydrolysis using introduction of water vapor without dilution with alcohol (refer to PTL 2).

By introducing heated $N_2$ into the device, the inside of the device is heated to 60° C. or more, optionally 80° C. or more, and chlorosilane with a high vapor pressure is discharged. While keeping the temperature, water vapor at 60° C. or more is brought into contact with the remaining solid chlorosilane polymer, which is thereby subjected to the hydrolysis. In order to complete the degradation of the solid chlorosilane polymer entirely to the inside thereof, the solid chlorosilane polymer is held for 48 hours at 60° C. when the thickness of the solid chlorosilane polymer is 0.2 mm.

This technique promotes the hydrolysis entirely to the inside of the chlorosilane polymer by introducing water vapor while keeping the temperature at 60° C. or more. However, it is difficult to embody this technique since a large-scale cleaning facility is utilized to keep the inside of the pipe at 60° C. or more and to spread water vapor entirely to the inside and since the temperature is controlled for a few days in order to degrade the chlorosilane polymer up to the inside thereof. Moreover, since the viscous liquid chlorosilane polymer slowly flows to a lower spot of the pipe, and is deposited much thereon, it takes a considerably long time to degrade the chlorosilane polymer up to the inside thereof.

What is claimed is:

1. A method for degrading a chlorosilane polymer generated secondarily in a step of a chemical vapor deposition method using chlorosilane-based gas, the method comprising:
    a step of bringing ethanol, allowing containing 10% or less of impurities including water, into contact with the chlorosilane polymer, degrading the chlorosilane polymer to alkoxide, hydrogen chloride and hydrogen, and diluting the degraded alkoxide, hydrogen chloride and hydrogen with the ethanol; and
    a step of performing hydrolysis for the alkoxide by pouring the ethanol containing the diluted alkoxide into water.

2. The method according to claim 1, wherein the step of the chemical vapor deposition method deposits at least one of silicon carbide, silicon and a silicon compound.

3. The method according to claim 2, wherein the alkoxide comprises tetraethoxysilane.

4. The method according to claim 2, wherein the chlorosilane-based gas comprises at least one of methyltrichlorosilane and trichlorosilane.

5. The method according to claim 1, wherein the chlorosilane-based gas comprises at least one of methyltrichlorosilane and trichlorosilane.

6. The method according to claim 1, wherein the alkoxide comprises tetraethoxysilane.

\* \* \* \* \*